United States Patent
Chang et al.

(10) Patent No.: US 6,548,425 B2
(45) Date of Patent: Apr. 15, 2003

(54) METHOD FOR FABRICATING AN ONO LAYER OF AN NROM

(75) Inventors: Kent Kuohua Chang, Taipei (TW); Uway Tseng, Tai-Chung Hsien (TW)

(73) Assignee: Macronix International Co. Ltd., Hsin-Chu (TW)

( * ) Notice: Subject to any disclaimer, the term of this patent is extended or adjusted under 35 U.S.C. 154(b) by 0 days.

(21) Appl. No.: 09/851,570

(22) Filed: May 10, 2001

(65) Prior Publication Data

US 2002/0168875 A1 Nov. 14, 2002

(51) Int. Cl.[7] .................................. H01L 21/31
(52) U.S. Cl. ............... 438/786; 438/396; 438/791; 438/954; 438/381; 438/761; 438/762
(58) Field of Search ................. 438/786, 791, 438/954, 396, 381, 761, 762, 259, 266, 257; 257/310, 296, 298, 324

(56) References Cited

U.S. PATENT DOCUMENTS

| | | | | |
|---|---|---|---|---|
| 4,814,291 A | * | 3/1989 | Kim et al. | |
| 4,882,649 A | * | 11/1989 | Chen et al. | 361/313 |
| 5,460,991 A | * | 10/1995 | Hong | |
| 5,498,890 A | * | 3/1996 | Kim et al. | 257/310 |
| 6,204,142 B1 | * | 3/2001 | Thakur | 438/396 |
| 6,274,902 B1 | * | 8/2001 | Kauffman et al. | 257/316 |

* cited by examiner

Primary Examiner—Matthew Smith
Assistant Examiner—V. Yevsikov
(74) Attorney, Agent, or Firm—Winston Hsu

(57) ABSTRACT

The present invention fabricates an oxide-nitride-oxide (ONO) layer of an NROM. A first oxide layer is formed on the surface of the substrate of a semiconductor wafer. Then two CVD processes are performed to respectively form a first nitride layer and a second nitride layer on the surface of the first oxide layer, and the boundary between the second nitride layer and the first nitride layer is so forming an interface. Thereafter, a second oxide layer is formed on the surface of the second nitride layer completing the process of manufacturing the ONO layer. The second nitride layer and the first nitride layer are used as a floating gate of the NROM, and the interface is used as a deep charge trapping center to improve the charge trapping efficiency, and furthermore, to improve the endurance and reliability of the NROM.

12 Claims, 3 Drawing Sheets

METHOD FOR FABRICATING AN ONO LAYER OF AN NROM

BACKGROUND OF THE INVENTION

1. Field of the Invention

The present invention relates to a method of fabricating an ONO layer of a nitride read only memory (NROM) cell.

2. Description of the Prior Art

A read only memory (ROM) device, comprising a plurality of memory cells, is a type of semiconductor wafer device that functions in data storage. The ROM device is widely applied in computer data storage and memory devices, and depending on the method of storing data, the ROM can be divided into several types such as a mask ROM, programmable ROM (PROM), erasable programmable ROM (EPROM), and an electrically erasable programmable ROM (EEPROM).

Differing from other types of ROMs that use a polysilicon or metal floating gate, a nitride read only memory (NROM) uses an insulating dielectric layer as a charge-trapping medium. Due to the highly compacted nature of the silicon nitride layer, hot electrons tunneling from the MOS transistor into the silicon nitride layer are trapped within to form an unequal concentration distribution to increase data reading speed and to avoid current leakage.

Please refer to FIG. 1 of a schematic diagram of a standard structure of an NROM according to the prior art. A semiconductor wafer 10 comprises a P-type silicon substrate 12, two N-type doped areas 14, 16 positioned on the surface of the silicon substrate 12, an ONO dielectric structure 24, and a gate conductor layer 26 positioned on the ONO dielectric structure 24. The ONO dielectric structure 24 is comprises a bottom oxide layer 18, a silicon nitride layer 20 and a top oxide layer 22.

Please refer to FIG. 2 and FIG. 3. FIG. 2 and FIG. 3 are schematic diagrams of a method for fabricating an NROM using the standard structure shown in FIG. 1. As shown in FIG. 2, according to the prior art for fabricating a gate of the NROM, a semiconductor wafer 30 comprising a P-type silicon 32 is first provided. A high temperature oxidation process is then performed to form an oxide layer with a thickness of 50–150 angstroms as a bottom oxide layer 34 on the surface of the silicon substrate 32. Then, a low-pressure chemical vapor deposition (LPCVD) is used to deposit a silicon nitride layer 36 with a thickness of 50–150 angstroms on the bottom oxide layer 34. An annealing process is used under a high temperature of 950° C. for a duration of 30 minutes to repair the structure of the silicon nitride layer 36. Also, water steam is injected to perform a wet oxidation process to form a silicon oxy-nitride layer with a thickness of 50–150 angstroms as a top oxide layer 38. The bottom oxide layer 34, the silicon nitride layer 36 and the top oxide layer 38 compose the ONO dielectric structure 40 on the surface of the silicon substrate 32.

As shown in FIG. 3, a photolithographic and etching process is performed to form a gate pattern in the top oxide layer 38 and silicon nitride layer 36. An ion implantation process is then performed to form a plurality of doped areas 42 as a source and drain in the MOS transistor. Thereafter, a thermal oxidation process is used to form a field oxide (FOX) 44 on the surface of the source/drain to isolate each silicon nitride layer 36. Finally, a doped polysilicon layer 46 is deposited as a gate conductor layer.

In the structure of the NROM according to the prior art, a silicon nitride layer is used as a charge trapping medium. However, the charge trapping efficiency of the silicon nitride layer is not good, so the trapped charges distribute widely in the silicon nitride layer. Moreover, trapped charges may leak from the silicon nitride layer resulting in a leakage current under the influence of vertical fields. Due to the wider charge distribution, incomplete erasing or a long erasing time is easily incurred in the subsequent erase state operation. Therefore, the life span and reliability of the NROM will be greatly affected.

SUMMARY OF THE INVENTION

It is therefore a primary objective of the present invention to provide a method of fabricating an ONO layer comprising a plurality of nitride layers, so as to improve the life span and reliability of the NROM.

In accordance with the claim invention, the method comprises firstly forming a first oxide layer on the surface of the substrate of a semiconductor wafer. Then two chemical vapor deposition (CVD) processes are performed to form a first nitride layer and a second nitride layer, respectively on the surface of the first oxide layer, with the boundary between the second nitride layer and the first nitride layer forming an interface. Thereafter, a second oxide layer is formed on the surface of the second nitride layer. The second oxide layer, the second nitride layer, the first nitride layer and the first oxide layer together construct the ONO layer.

The present invention uses the interface between the two silicon nitride layers as a deep charge trapping center so as to improve the charge trapping efficiency of the floating gate of the NROM, and furthermore, to improve the endurance and reliability of the NROM.

DESCRIPTION OF THE PREFERRED EMBODIMENT

Figure 1:
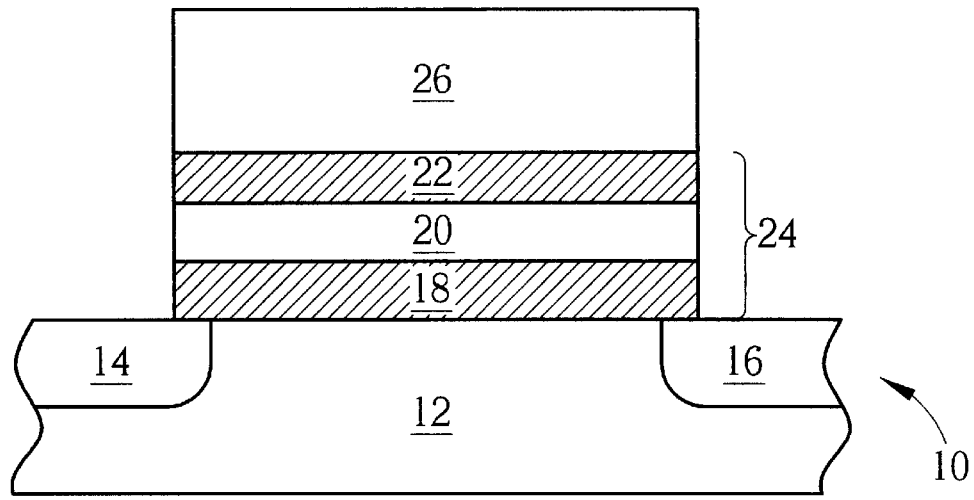
FIG. 1 is a schematic diagram of a standard structure of an NROM according to the prior art.
Figure 2:
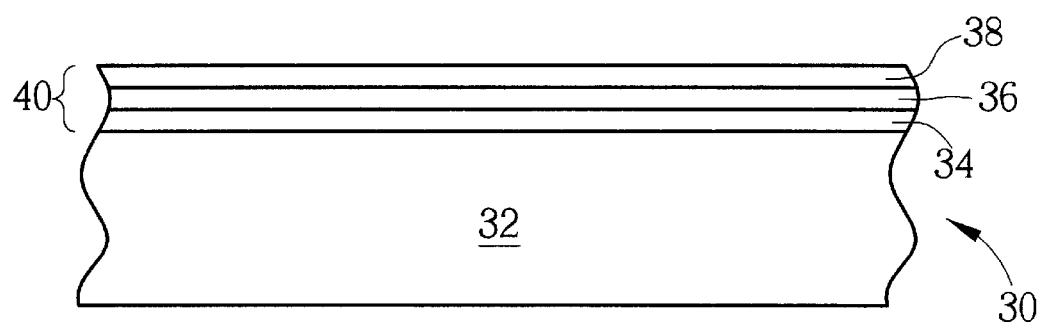
FIG. 2 and FIG. 3 are schematic diagrams of a method for fabricating an NROM using the standard structure shown in FIG. 1.
Figure 3:
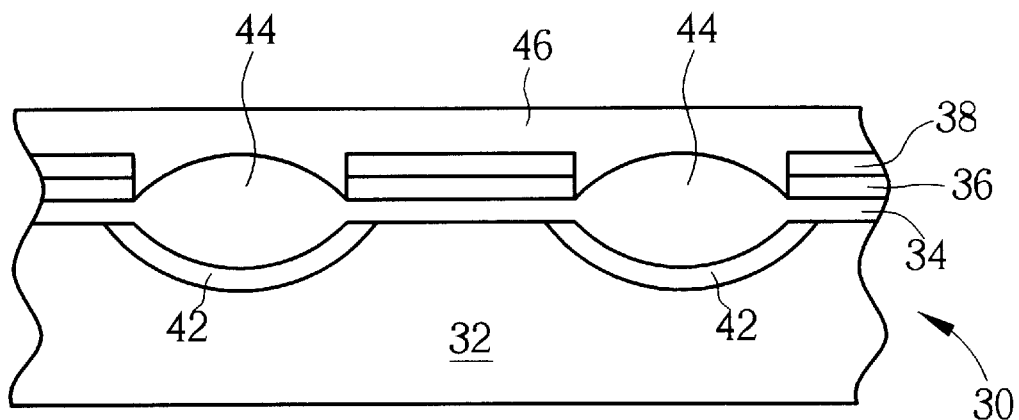
Figure 4:
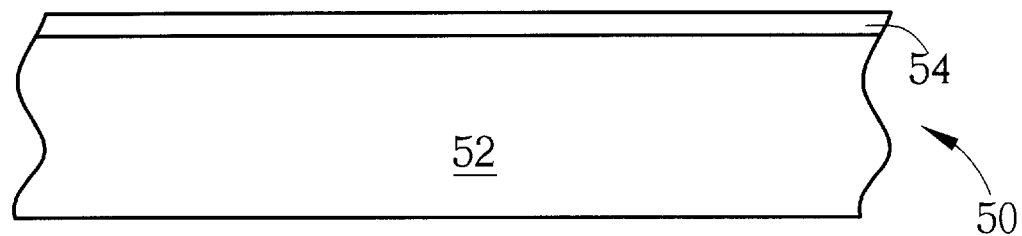
FIG. 4 to FIG. 6 are schematic diagrams of a method for fabricating an ONO layer of an NROM according to the present invention.
Figure 5:
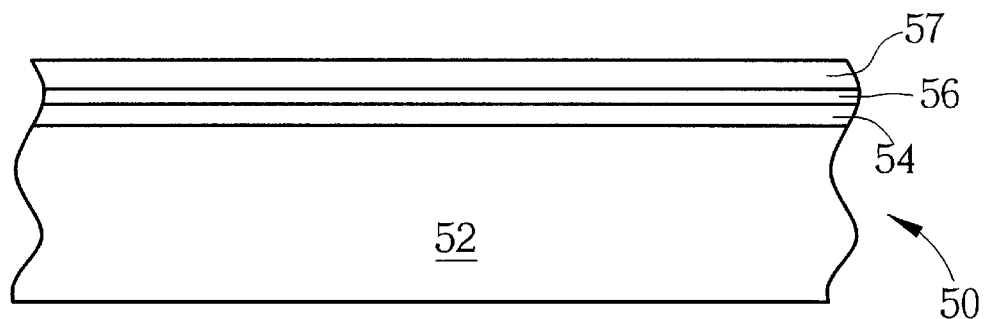
Figure 6:
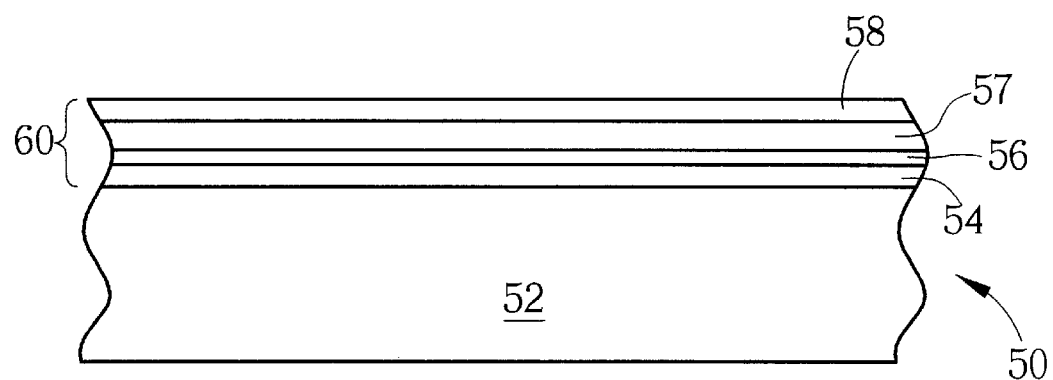

Please refer to FIG. 4 to FIG. 6. FIG. 4 to FIG. 6 are schematic diagrams of a method for fabricating the ONO layer of an NROM according to the present invention. As shown in FIG. 4, the ONO layer according to the present invention is fabricated on the surface of the silicon substrate 52 or a silicon-on-insulator (SOI) substrate (not shown) of a semiconductor wafer 50. A thermal oxidation process is performed to oxidize the silicon surface of the substrate 52 so as to form a bottom oxide layer 54 with a thickness of 40–100 angstroms as a tunneling oxide layer of an nitride read only memory (NROM). The thermal oxidation process using oxygen ($O_2$) and T-LC ($Cl_2$) as precursors is performed at a temperature of 800° C. in a nitrogen-and-oxygen-containing ($N_2/O_2$) environment.

Next, a rapid thermal nitridation (RTN) process is performed. The process uses nitrous oxide ($N_2O$) or nitric oxide (NO) as reacting gas at a temperature of 800–1050° C. for annealing the bottom oxide layer 54 and simultaneously nitrifying the surface of the bottom oxide layer 54 within a duration of 60 seconds.

As shown in FIG. 5, a chemical vapor deposition (CVD) process is performed. The temperature and pressure of the CVD process are 700° C. and 0.6 Torr respectively, and the CVD process uses dichlorosilane ($SiCl_2H_2$, DCS), ammonia ($NH_3$) and nitrogen ($N_2$) as reacting gases so as to form a first nitride layer 56 with a thickness of 20–40 angstroms on the surface of the bottom oxide layer 54.

Then, another CVD process is performed to form a second nitride layer 57 on the surface of the first nitride layer 56, which is stacked on the first nitride layer 56 to construct a floating gate of the NROM. The temperature and pressure of the CVD process are 700° C. and 0.6 Torr respectively, and the CVD process uses dichlorosilane (SiCl2H2, DCS), ammonia (NH3) and nitrogen (N2) as reacting gases so as to form a second nitride layer 57 with a thickness of 80–130 angstroms on the surface of the first nitride layer 56, with the boundary between the second nitride layer 57 and the first nitride layer 56 forming an interface used as a deep charge trapping center to improve the charge trapping efficiency of a floating gate of the NROM.

Finally as shown in FIG. 6, another thermal oxidation process is performed at a temperature of 1000° C. and in a steam-containing environment for oxidizing the surface of the second nitride layer 57 so as to form a top oxide layer 58 with a thickness of approximately 90 angstroms (Å). The top oxide layer 58, the second nitride layer 57, the first nitride layer 56 and the bottom oxide layer 54 together construct the ONO layer 60 of an NROM.

The NROM according to the present invention uses the interface between two silicon nitride layers as a deep charge trapping center, so CVD processes can be performed repeatedly for forming more than two silicon nitride layers so as to improve the interface layers between silicon nitride layers. Furthermore, the charge trapping efficiency of the floating gate of the NROM is improved.

In contrast to the prior art method for fabricating the ONO layer of an NROM, the present invention fabricates an ONO layer comprising a plurality of silicon nitride layers. The interface between silicon nitride layers is used as a deep charge trapping center for reducing charge distribution and increasing trapping efficiency of electrons and electric holes so as to improve the endurance and reliability of the NROM.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for fabricating an oxide-nitride-oxide (ONO) layer of a nitride read only memory (NROM), the method comprising:

providing a substrate;

forming a first oxide layer on the surface of the substrate;

forming a first nitride layer and a second nitride layer, which is stacked on the first nitride layer, on the surface of the first oxide layer, and the boundary between the second nitride layer and the first nitride layer so forming a deep charge trapping center of the NROM; and forming a oxide layer on the surface of the second nitride layer by performing a second thermal oxidation process in a steam-containing environment;

wherein the second oxide layer, the second nitride layer, the first nitride layer and the first oxide layer together construct the ONO layer.

2. The method of claim 1 wherein the substrate is a silicon substrate or a silicon-on-insulator (SOI) substrate.

3. The method of claim 2 wherein the first oxide layer is formed by performing a first thermal oxidation process to oxidize the silicon surface of the substrate, which serves as a tunneling oxide layer of the NROM, with the thickness of the first oxide layer between 40 and 100 angstroms (Å).

4. The method of claim 3 wherein the first thermal oxidation process is performed within at a temperature of 800° C. and in a nitrogen and oxygen ($N_2/O_2$) environment.

5. The method of claim 3 wherein the precursors of the first thermal oxidation process are oxygen ($O_2$) and T-LC ($Cl_2$).

6. The method of claim 1 wherein a rapid thermal nitridation (RTN) process is also performed for annealing the first oxide layer and simultaneously nitrifying the surface of the first oxide layer.

7. The method of claim 6 wherein the duration of the RTN process is about 60 seconds, the temperature of the process is from 800 to 1050° C., and the reacting gas of the RTN process is nitrous oxide ($N_2O$) or nitric oxide (NO).

8. The method of claim 1 wherein the thickness of the first nitride layer is between 20 and 40 angstroms (Å), and the thickness of the second nitride layer is between 80 and 130 angstroms (Å).

9. The method of claim 1 wherein the first and second nitride layer are formed by respectively performing a first and a second chemical vapor deposition (CVD) process.

10. The method of claim 9 wherein the first and second CVD process are both a low-pressure chemical vapor deposition (LPCVD) process performed at a temperature of 700° C. and a pressure of 0.6 Torr, and the reacting gases of the LPCVD process comprise dichlorosilane ($SiCl_2H_2$, DCS), ammonia ($NH_3$) and nitrogen ($N_2$).

11. The method of claim 1 wherein the thickness of the second oxide layer is approximately 90 angstroms (Å).

12. The method of claim 1 wherein the second thermal oxidation process is performed at a temperature of approximately 1000° C.

* * * * *